United States Patent [19]

Maejima et al.

[11] Patent Number: 5,696,715
[45] Date of Patent: Dec. 9, 1997

[54] SEMICONDUCTOR MEMORY DEVICE HAVING BIPOLAR AND FIELD EFFECT TRANSISTORS AND AN IMPROVED COUPLING ARRANGEMENT FOR LOGIC UNITS OR LOGIC BLOCKS

[75] Inventors: Hideo Maejima; Ikuro Masuda, both of Hitachi, Japan

[73] Assignee: Hitachi, Ltd., Tokyo, Japan

[21] Appl. No.: 387,628

[22] Filed: Feb. 13, 1995

Related U.S. Application Data

[63] Continuation of Ser. No. 971,565, Nov. 5, 1992, abandoned, which is a continuation of Ser. No. 795,268, Nov. 20, 1991, abandoned, which is a continuation of Ser. No. 580,533, Sep. 11, 1990, abandoned, which is a division of Ser. No. 530,401, May 30, 1990, abandoned, which is a continuation of Ser. No. 313,293, Feb. 23, 1989, abandoned, which is a continuation of Ser. No. 13,204, Feb. 6, 1987, abandoned, which is a continuation of Ser. No. 535,054, Sep. 23, 1983, abandoned.

[30] Foreign Application Priority Data

Sep. 29, 1982 [JP] Japan ............... 57-168502
Oct. 27, 1982 [JP] Japan ............... 57-187569

[51] Int. Cl.[6] ............... G11C 11/407; G11C 11/417; H03K 19/01; H03K 19/0175
[52] U.S. Cl. ............... 365/177; 365/189.05; 365/208; 365/230.06; 326/64; 326/84; 326/110
[58] Field of Search ............... 365/177, 230.06, 365/205, 207, 208, 189.05, 189.08; 326/64, 65, 66, 84, 85, 89, 105, 108, 109, 110

[56] References Cited

U.S. PATENT DOCUMENTS

| | | | |
|---|---|---|---|
| 3,553,541 | 1/1971 | King | 307/446 |
| 3,631,528 | 12/1971 | Green | 307/446 |
| 4,103,188 | 7/1978 | Morton | 307/570 |
| 4,301,383 | 11/1981 | Taylor | 307/446 |
| 4,335,449 | 6/1982 | Nokubo | 365/177 |

FOREIGN PATENT DOCUMENTS

| | | | |
|---|---|---|---|
| 0058193 | 5/1981 | Japan | 365/177 |

OTHER PUBLICATIONS

Lin et al, "Complementary MOS–Bipolar Transistor Structure", IEEE Transactions on Electron Devices, vol. ED–16, No. 11, Nov. 1969, pp. 945–951.

*Primary Examiner*—Glenn Gossage
*Attorney, Agent, or Firm*—Antonelli, Terry, Stout & Kraus, LLP

[57] ABSTRACT

A semiconductor integrated circuit memory device has at least two logic blocks, each logic block including at least two logic units and each logic unit having a number of metal oxide semiconductor field effect transistors (MOS FET's) integrated therein. Bipolar transistors for driving the MOS FET's are selectively arranged between the logic blocks and/or the logic units so as to shorten a critical path of a logic block. The memory device may include a word driver circuit having a bipolar transistor connected to MOSFETs in an address decoder and memory cells of the memory device. The memory device may also include a sense circuit having a bipolar transistor for high speed discharge of a bit line, as well as an output buffer including a bipolar transistor for reducing signal transmission delays in driving a bus.

3 Claims, 13 Drawing Sheets

SEMICONDUCTOR MEMORY DEVICE HAVING BIPOLAR AND FIELD EFFECT TRANSISTORS AND AN IMPROVED COUPLING ARRANGEMENT FOR LOGIC UNITS OR LOGIC BLOCKS

This application is a continuation of application Ser. No. 07/971,565 filed Nov. 5, 1992, now abandoned, which is a continuation of application Ser. No. 07/795,268 filed Nov. 20, 1991, now abandoned; which is a continuation of application Ser. No. 07/580,533 filed Sep. 11, 1990, now abandoned; which is a divisional of application Ser. No. 07/530,401 filed May 30, 1990, now abandoned; which is a continuation of application Ser. No. 07/313,293 filed Feb. 23, 1989, now abandoned; which is a continuation of application Ser. No. 07/013,204 filed Feb. 6, 1987, now abandoned; which is a continuation of application Ser. No. 06/535,054 filed Sep. 23, 1983, now abandoned.

The present invention relates to a semiconductor integrated circuit device, and more particularly to a semiconductor integrated circuit device suitable to a high density and high speed logic large scale integration.

The advancement in semiconductor technology in recent years is remarkable, particularly in a field of MOS (metal oxide semiconductor). As the MOS technology has been developed, small scaling of devices have been accelerated and many circuits can be integrated on a silicon chip of several milimeters square.

However, as the integration density of the LSI increases by the improvement of the MOS technology, a plurality of logic blocks each comprising a number of MOS field effect transistors can be formed on one silicon chip. In coupling the logic blocks on the chip, a capacitive load increases, which results in the decrease of a signal transmission rate. A cause of the increase of the capacitive load resides in the use of a number of MOS field effect transistors which are voltage devices. Thus, a weak point of the MOS field effect transistors appears.

FIG. 1 shows a configuration of a one-chip microcomputer which is a typical example of a highly integrated logic LSI. The LSI which forms the microcomputer 100 has logic blocks such as a ROM (read-only memory) 112, a RAM (random access memory) 113, a processor 114, a timer 115 and a peripheral circuit 116 arranged inside of input/output buffers 111 arranged in an outer periphery of a chip and interconnected through an internal bus 117. While not shown, a clock circuit is also one of the logic blocks. As the respective elements are highly integrated and a circuit scale of each element increases, a large number of MOS field effect transistors are integrated. As a result, the following problems occur.

One of the problems is the increase of signal transmission delay in each logic block. As the integration densities of the ROM 112 and the RAM 113 increase, the total number of bits of the memory naturally increases. An example of a high integration memory is explained below for the ROM 112.

FIG. 2 shows a block diagram of the ROM 112 which is one of the logic blocks of the microcomputer shown in FIG. 1. The ROM 112 comprises address input buffers 10, word drivers 12, multiplexer and sense circuits 15, which serve as coupling circuits, and an address decoder 11 and memory cells 13 which serve as logic units. Those coupling circuits and the logic units are interconnected through an address input bus 118, an address buffer output bus 120, a decoder output bus 122 and buses through which word signals 124, bit signals 126 and data outputs 128 are transmitted.

In the prior art device, those coupling circuits are formed by the MOS field effect transistors. As the total number of bits of the ROM 112 increases, sizes of arrays of the address decoder 11 and the memory cells 13 increase. As a result, a load of the address input buffers 10 which drive the address decoder 11 and a load of the word drivers 12 which drive the memory cells 13 increase, which results in the delay of the signal transmission. In FIG. 3, 122-i denotes an i-th decoder output of a number of decoder outputs, 123-i denotes an i-th driver of a number of word drivers and 124-i denotes an i-th word signal. Assuming that 123-i of the word drivers 12 is formed by a CMOS (complementary MOS) field effect transistor (FET), it needs sufficiently large P and N-channel MOS FET's as shown in FIG. 3 in order to drive a heavy load. When the MOS FET's having large current capacities are used in the coupling circuits, the signals are delayed in the coupling circuits because of the increase of the output load, and it is difficult to attain a remarkable signal transmission speed effect.

Secondly, the delays of the signal transmission among the respective logic blocks increase. As in the case of the delay of the signal transmission in each logic block, when the number of logic blocks in the system in a chip level increases, a load including the internal bus 117 for interconnecting the logic blocks also increases and the signal transmission delay is remarkable when the signal is transmitted from one logic block to another or a plurality of logic blocks.

The increase of the signal transmission delay due to a number of MOS FET's in the respective logic blocks and the increase of the signal transmission delay among the logic blocks significantly affect processing speed of a high integration logic circuit device such as a one-chip microcomputer. Since the LSI like the microcomputer performs more complex operations than a single function circuit device such as a memory LSI, the functions of the logic blocks in the chip are different from each other and flow paths of processing or processing times in the respective logic blocks differ depending on a particular condition a limit of the processing speed of the overall system of the microcomputer is determined by an integration of the limits of the processing times of the respective logic blocks of the computer or an integration of the critical paths. Accordingly, if the critical path in the logic block is shortened, the limit of the processing speed of the microcomputer is reduced. Thus, if the signal transmission delay due to the MOS FET's in the logic circuit forming the critical path of the logic block is reduced, the limit of the processing speed of the microcomputer can be reduced. For this purpose, therefore, it is not necessary to consider the signal transmission delays by the MOS FET's which do not form the critical paths.

The increase of the signal transmission delay in the respective logic blocks and the increase of the signal transmission delay among the logic blocks are due to a lack of a current driving capability of the MOS FET's used. In order to enhance the current driving capability, it has been proposed to use bipolar transistors instead of the MOS FET's. (See Japanese Laid-Open Patent Applications 55-129994 and 56-58193.) However, those references relate to a single function semiconductor memory LSI and they do not discuss problems regarding the signal delay among the logic blocks or the signal delay in the respective logic blocks in the high integration semiconductor circuit device comprising a plurality of logic blocks to which the present invention is applied. In the semiconductor memory LSI disclosed in those references, the processing time required to produce a corresponding data is constant whichever address may be selected, and the references do not discuss the effect on the critical path by the signal delay due to the MOS FET's.

It is an object of the present invention to provide a semiconductor integrated circuit device which allows a high integration without impeding a high speed signal transmission.

The above object is attained, in accordance with the present invention, by inserting a coupling circuit having at least a portion thereof formed by a bipolar transistor capable of flowing a large current to drive large loads among logic units formed by MOS FET's and among logic blocks formed by the logic units.

Those and other objects and advantages of the present invention will be apparent from the following description of the invention discussed in connection with the accompanying drawings, in which.

Figure 2:
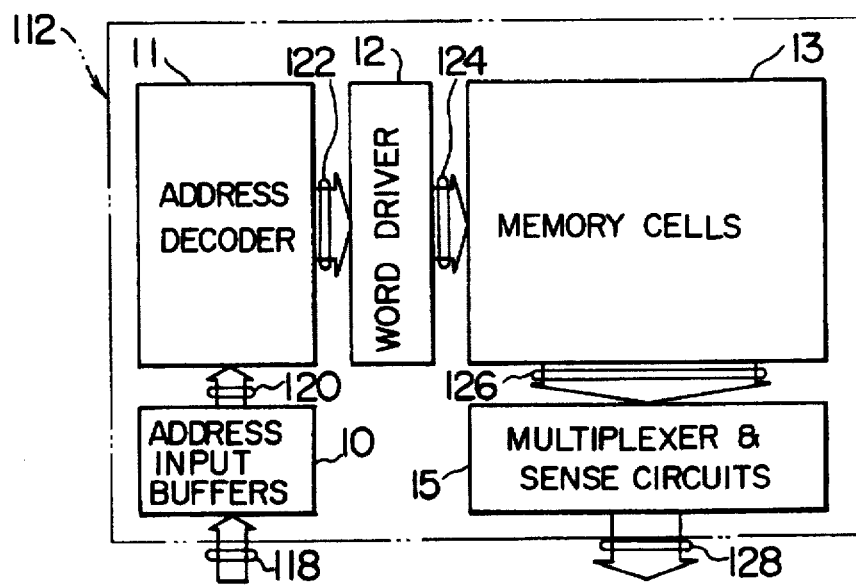
FIG. 2 shows a configuration of a ROM used in FIG. 1.
Figure 3:
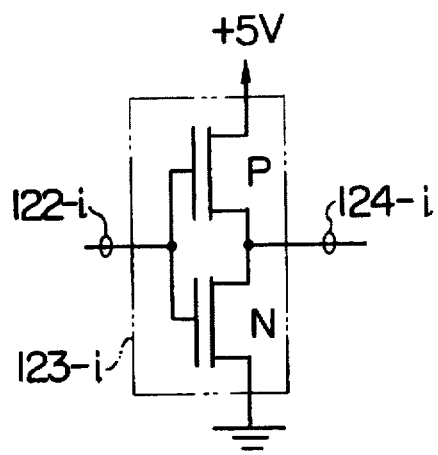
Figure 4:
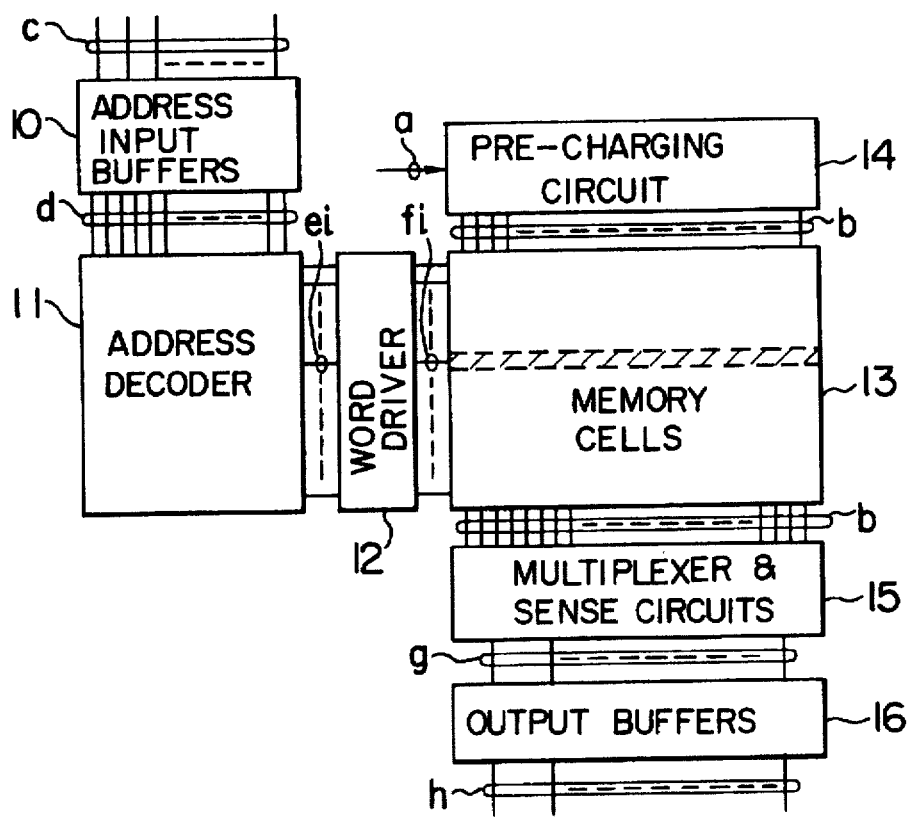
Figure 5:
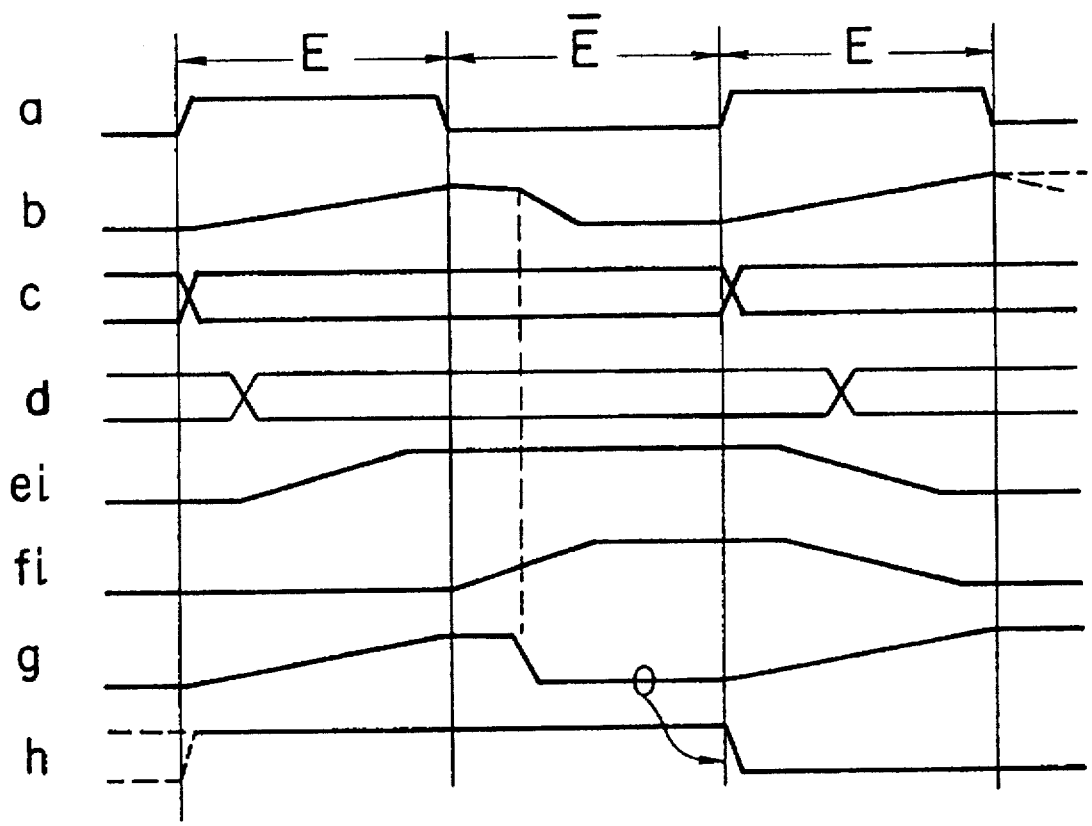
Figure 6:
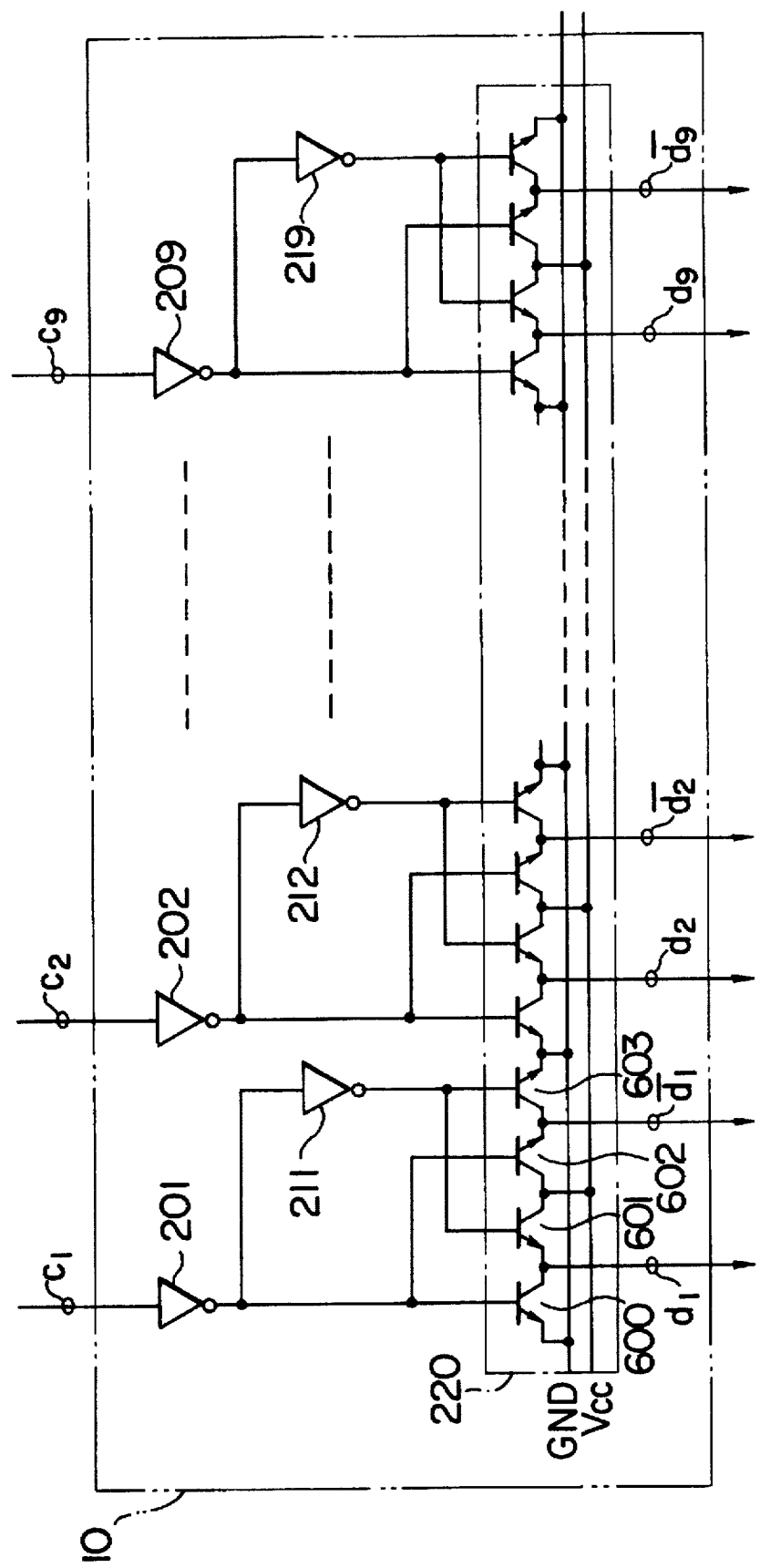
Figure 7:
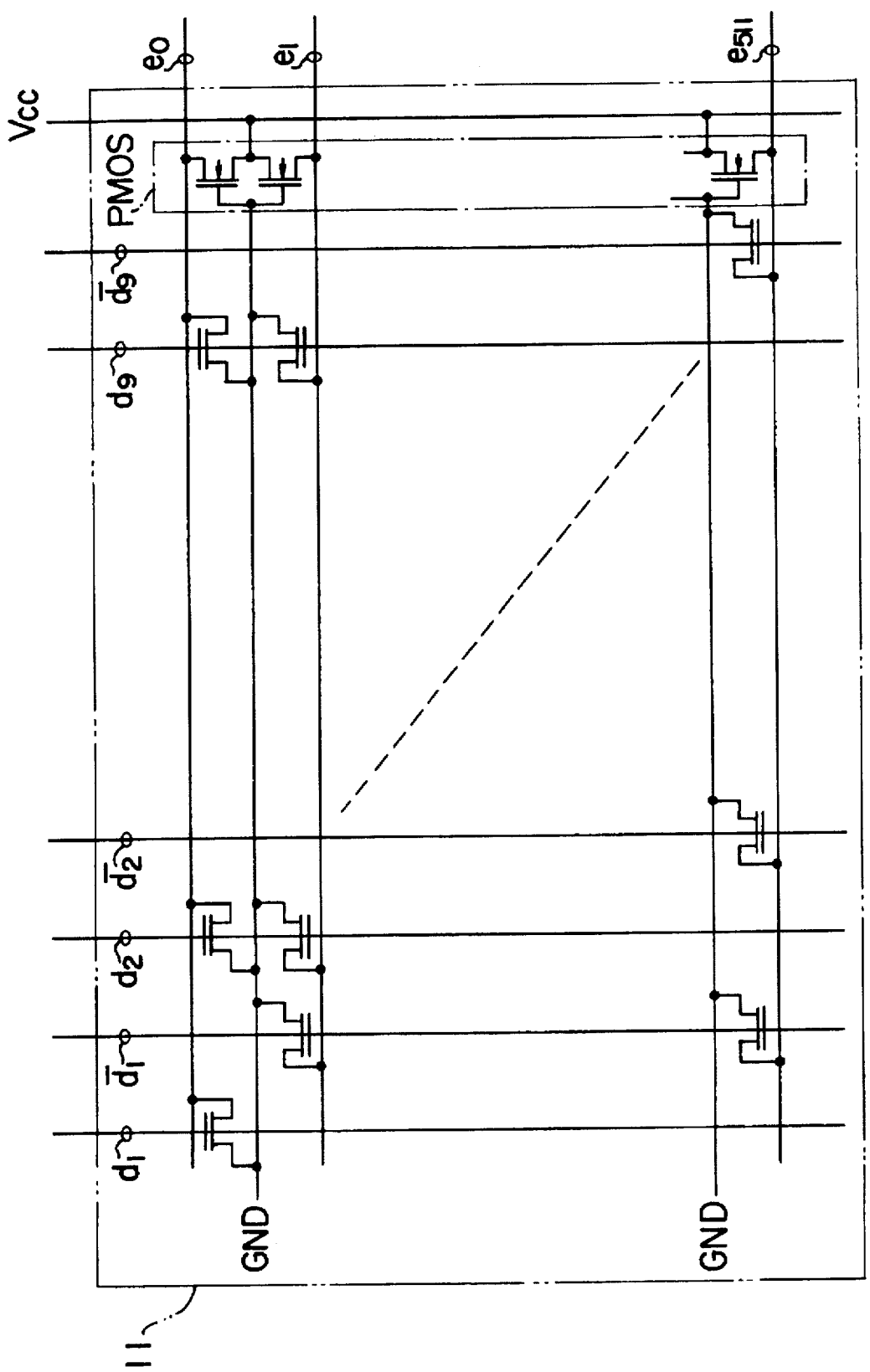
Figure 8:
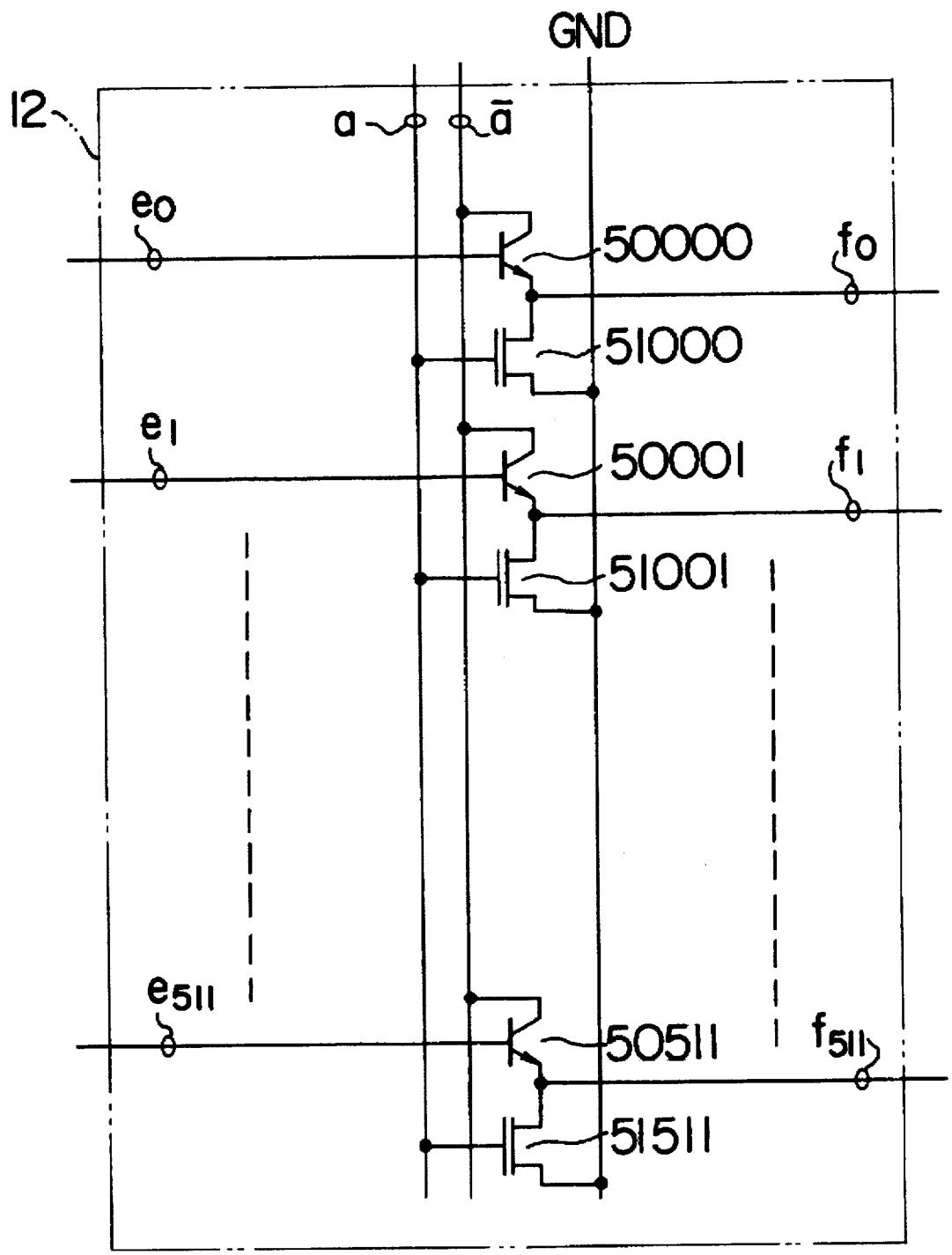
Figure 9:
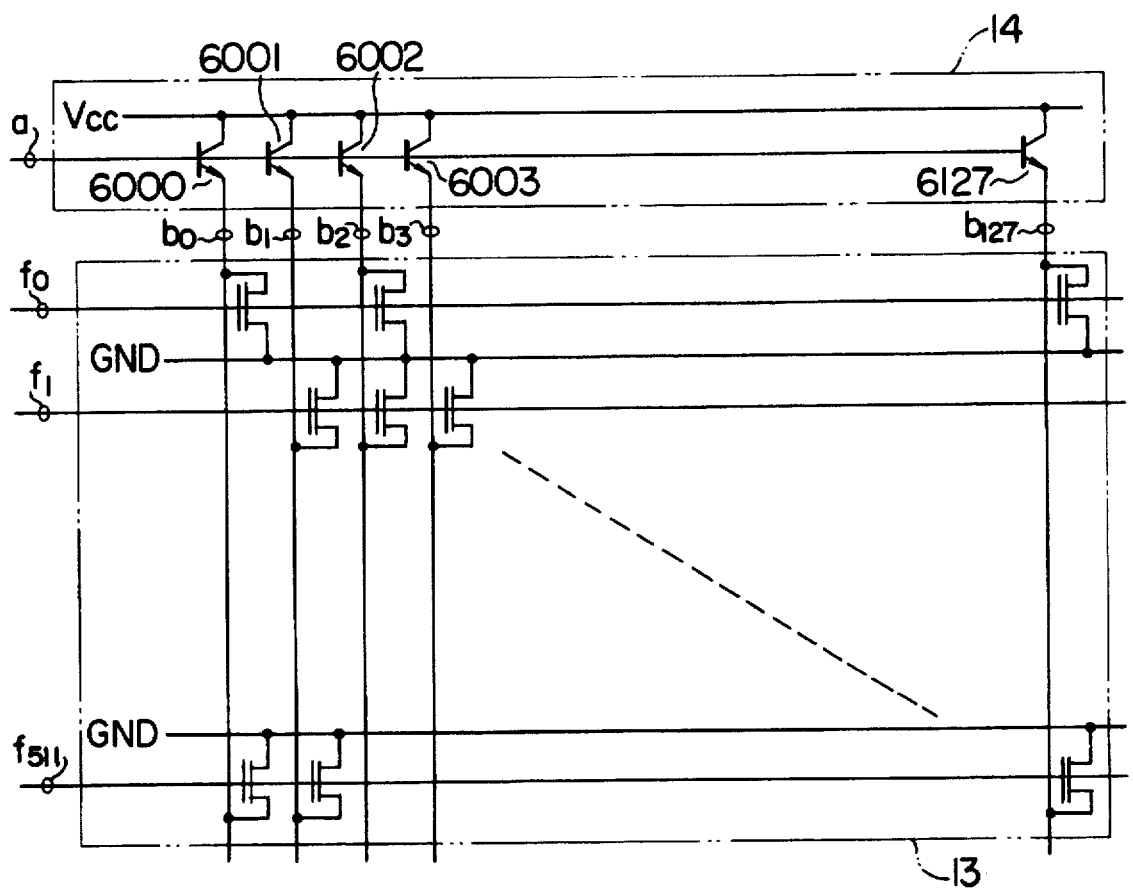
Figure 10:
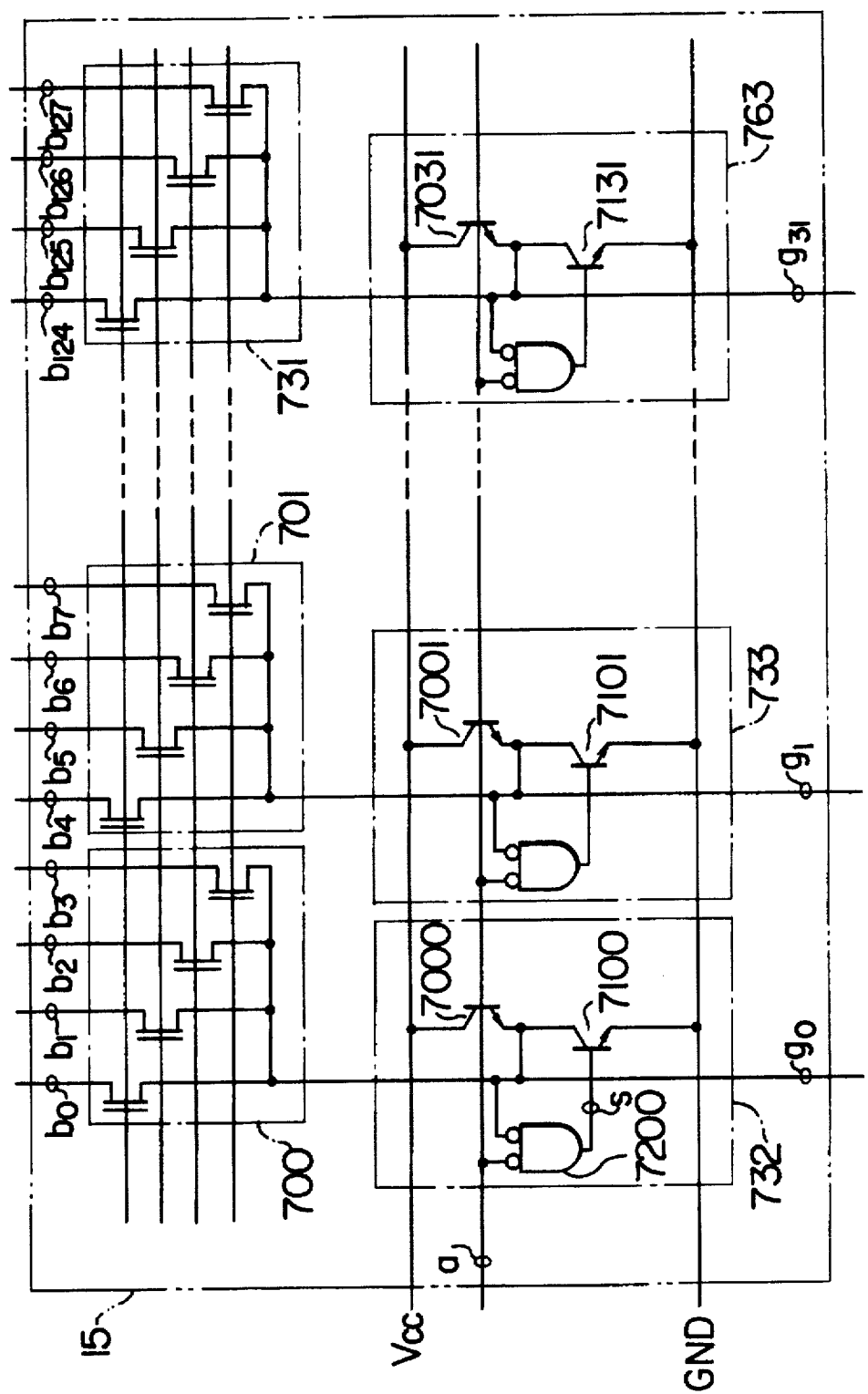
Figure 11A:
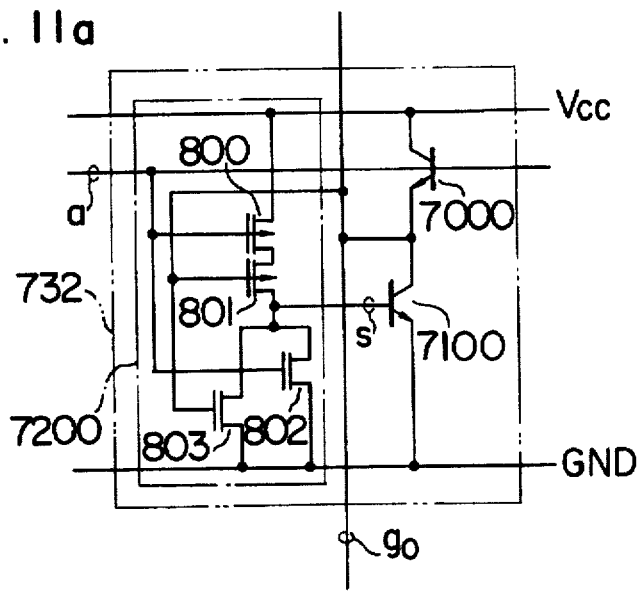
Figure 11B:
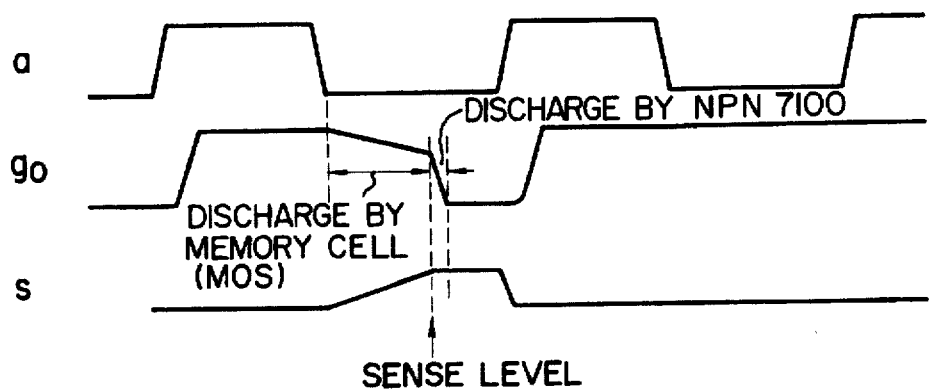
Figure 12:
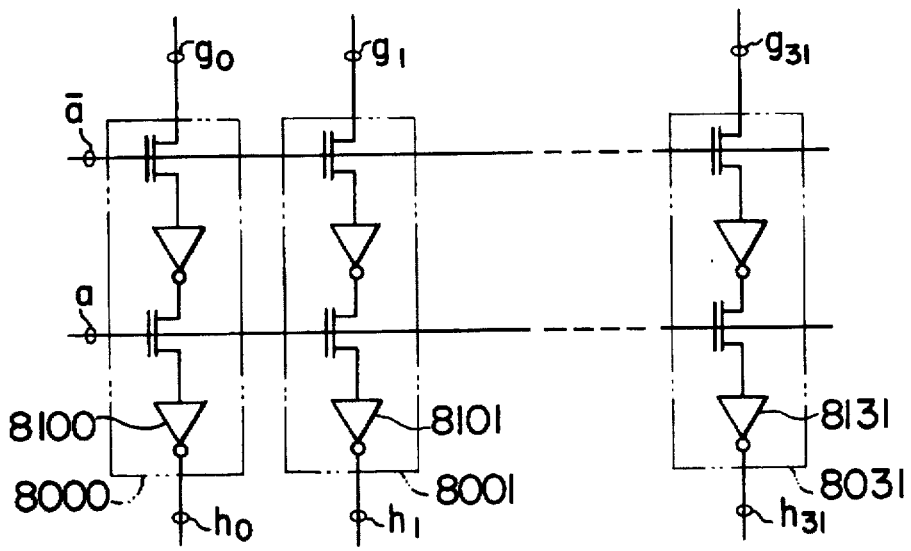
Figure 13:
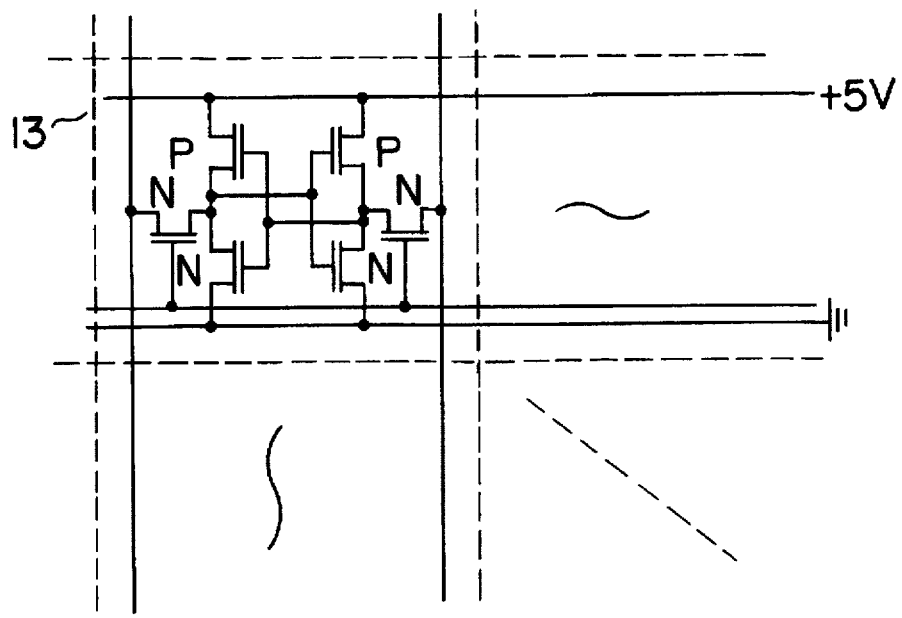
Figure 14:
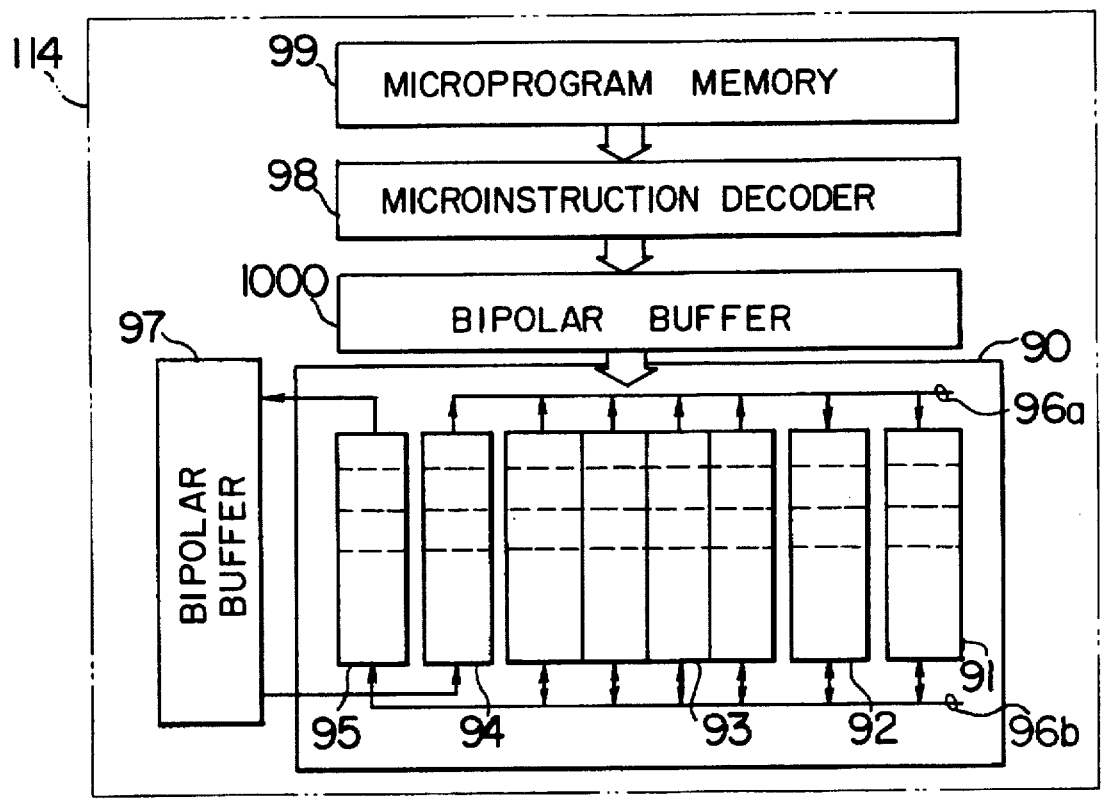
Figure 15:
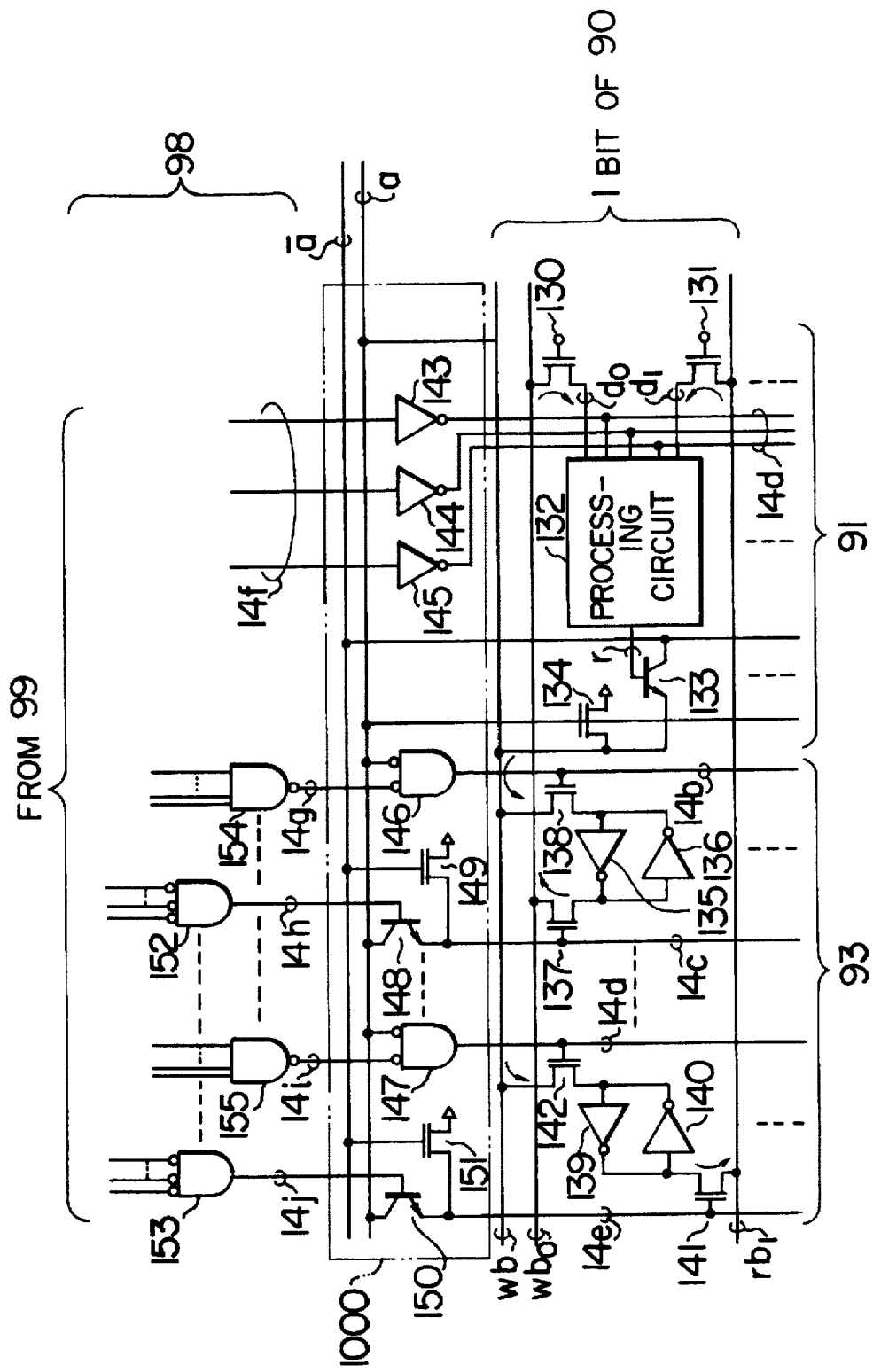
Figure 16:
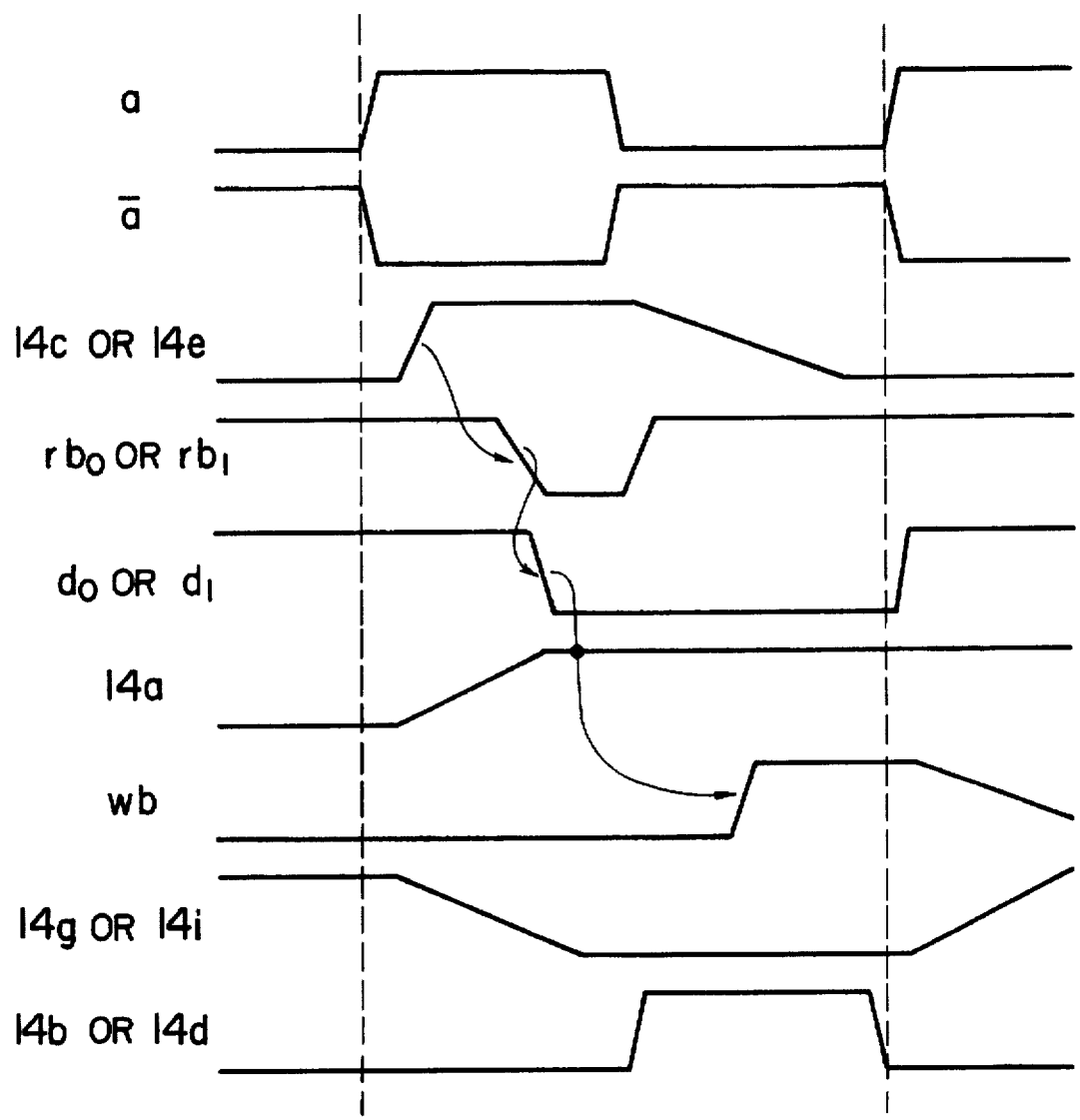
Figure 17:
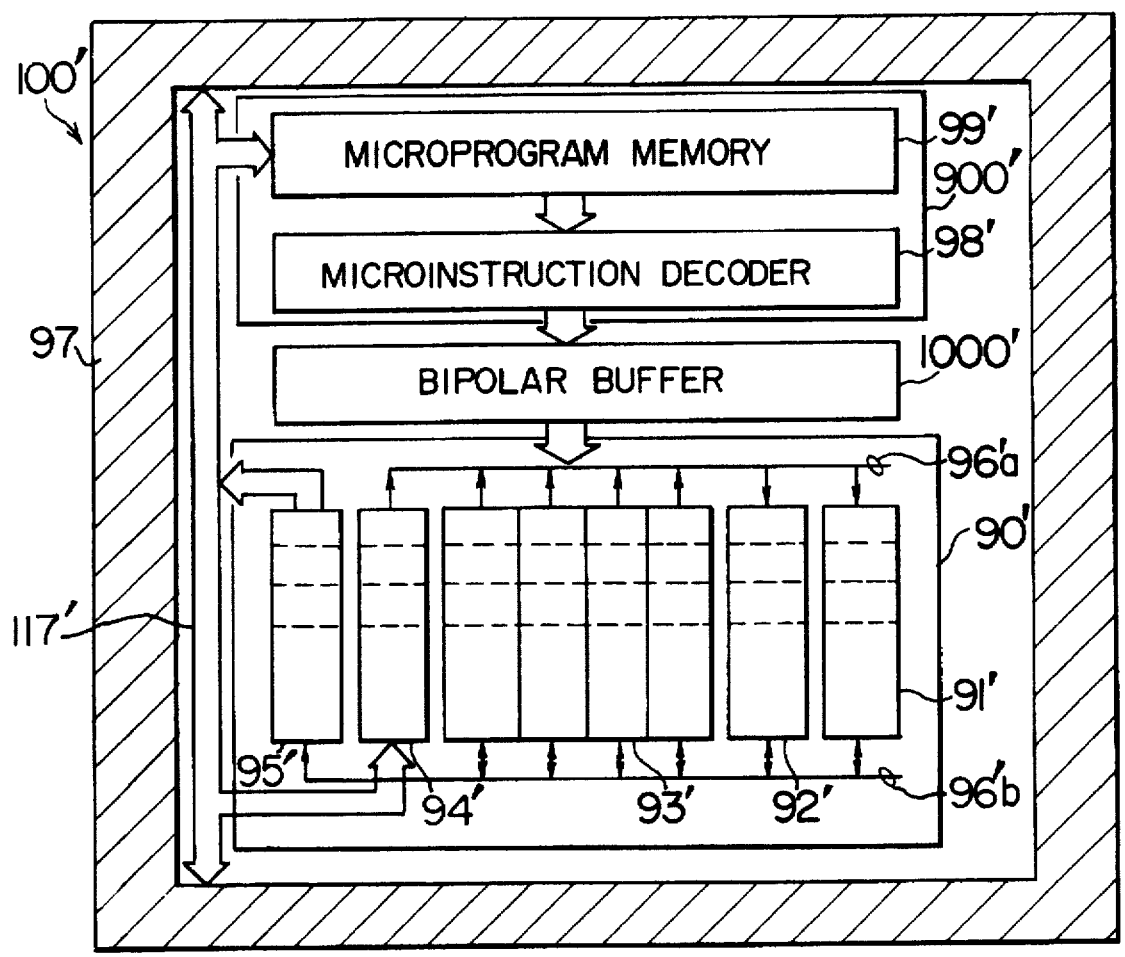

FIG. 3 is a circuit diagram of a portion of a word drive buffer 12 shown in FIG. 2, FIG. 4 shows an overall configuration of a ROM of the microcomputer in one embodiment of the present invention, FIG. 5 shows signal waveforms of the circuit of FIG. 4, FIG. 6 shows a configuration of address input buffers, FIG. 7 shows a configuration of an address decoder, FIG. 8 shows a configuration of word drivers, FIG. 9 shows a circuit diagram of memory cells and a precharging circuit, FIG. 10 shows a configuration of multiplexer and sense circuits, FIG. 11a shows a configuration of the sense circuits of FIG. 10, FIG. 11b shows waveforms of the circuits of FIG. 11a, FIG. 12 shows a configuration of output buffers with latches, FIG. 13 shows a circuit diagram of a RAM of the microcomputer in the embodiment of the present invention, FIG. 14 shows a configuration of a processor of the microcomputer in the embodiment of the present invention, FIG. 15 shows a circuit diagram of a main portion of FIG. 14, FIG. 16 shows waveforms in the circuit of FIG. 15, and FIG. 17 shows a configuration of a high integration processor device in another embodiment of the present invention.

Figure 1:
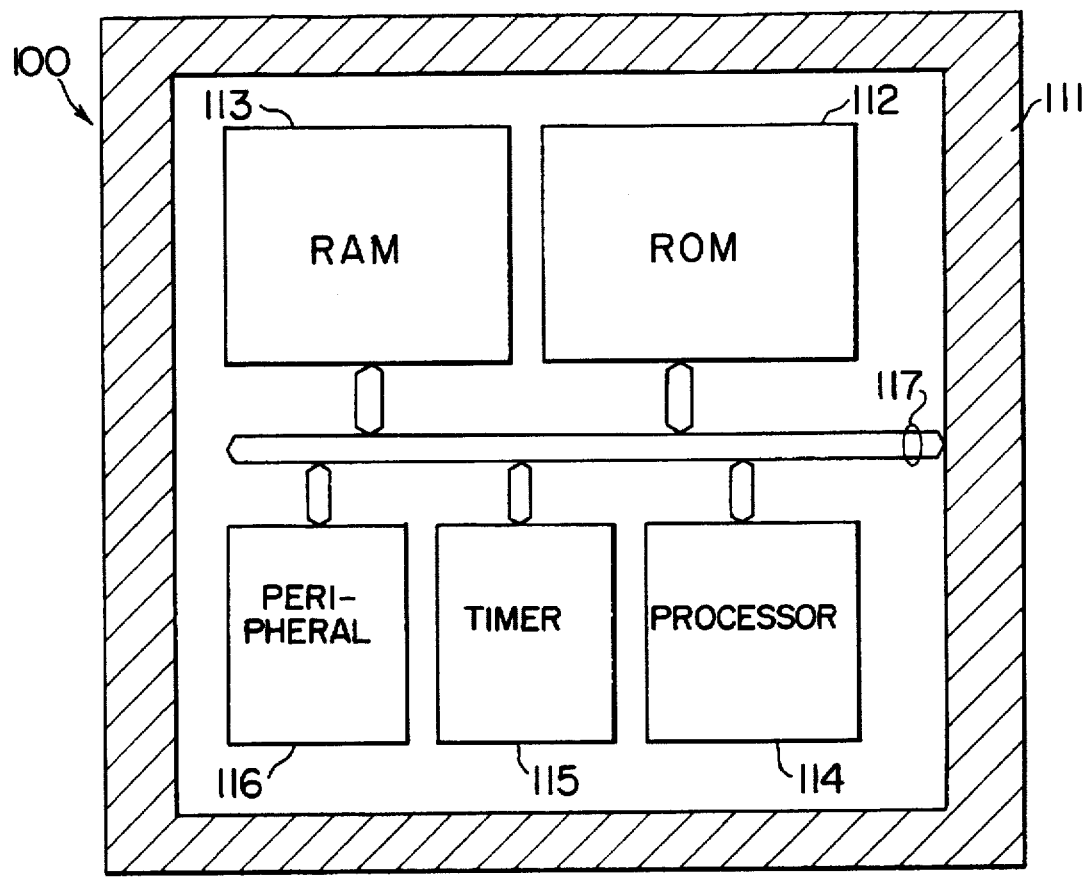
FIG. 1 shows a configuration of a typical microcomputer constructed by an LSI.

One embodiment of the present invention is now explained with reference to the drawings in which the like elements to those of FIGS. 1 and 2 are designated by the like numerals.

FIG. 4 shows an overall configuration of a ROM in one embodiment of the present invention, and FIG. 5 shows waveforms thereof. The present embodiment shows a dynamic ROM which is one of the logic blocks and it comprises address input buffers 10, an address decoder 11, word drivers 12, memory cells 13, a bit line pre-charging circuit 14, bit line multiplexer and sense circuits 15 and output buffers 16. The operation is now explained for a first half period (E) and a second half period ($\bar{E}$) of a reference clock a.

Period E

During this period, the bit lines b are pre-charged and an address is decoded. The bit lines b are charged by the reference clock a applied to the pre-charging circuit 14 so that they are rendered to high levels. On the other hand, an address signal c applied to the address input buffers 10 is converted to a pair of positive and negative signals d ($d_1$, $\bar{d}_1$ in FIG. 6, e.g.) by the buffers 10, which are supplied to the address decoder 11. As a result of decoding, a word signal $e_i$ assumes a high level to select a memory word. Those operations occur during the period E.

Period $\bar{E}$

A word in the memory cells 13 is selected by a word drive signal fi established during the period E and the bit lines b pre-charged during the period E are selectively discharged in accordance with the states of the memory cells which constitute the selected word. As a result, a data is reflected to the bit lines b, and a signal g is produced by the multiplexer and sense circuits 15. A memory data h is read out from the output buffers 16.

In the ROM of FIG. 1, the precharge and the discharge are repeated so that the data read cycles are repeated.

Details of the logic units of the ROM of FIG. 4 are now explained with reference to FIGS. 6, 7, 8, 9, 10, 11, 12a and 12b.

Address Input Buffers 10

FIG. 6 shows a detail of the address input buffers 10 shown in FIG. 4. Assuming that a 64K-bit ROM is used and a bit length of one word selected by the address decoder 11 is 128-bit length, the address signal c applied to the address input buffers 10 is of 9-bit length ($2^9=512$) to select one of 512 words. The 9-bit address signal c is converted to the pair of positive and negative signals d (18 lines) by the buffers 201–209 and 211–219 and they are supplied to the address decoder 11. The address decoder 11 decodes one of the 512 words. Thus, the 18-line signal d drives one of 256 MOS FET's. In order to enhance a driving power, NPN bipolar transistors 220 are arranged in a final stage comprised of an address input driver circuit.

The output of the buffer 201 constituted by MOS FET's is supplied to the other buffer 211 and to the bases of the NPN bipolar transistors 600 and 602. The output of the buffer 211 is supplied to the bases of the NPN transistors 601 and 603. Accordingly, when the address signal cl is "0", the output of the buffer 201 is "1" and the output of the buffer 211 is "0", and the NPN bipolar transistors 600 and 602 are ON while the NPN bipolar transistors 601 and 603 are OFF. In the address input driver circuit 220, the collectors of the NPN bipolar transistors 601 and 602 are connected to Vcc (power supply), the emitters of the transistors 600 and 603 are connected to GND (ground), the collector of the transistor 600 and the emitter of the transistor 601 are interconnected, the collector of the transistor 603 and the emitter of the transistor 602 are interconnected and signal lines $d_1$ and $\bar{d}_1$ are taken out from the junctions. The signal line $d_1$ is rapidly discharged by the NPN transistor 600 and the signal line $\bar{d}_1$ is rapidly charged by the NPN transistor 602. As a result, the signal line $d_1$ assumes "0" and the signal line $\bar{d}_1$ assumes "1" so that a pair of signals are produced.

In this manner, one of the transistors in each of the NPN transistor pairs 600 and 601, and 602 and 603 is ON (and the other is OFF) so that they operate like CMOS circuits. Accordingly, the current flows only when the address signal cl changes and hence a low power consumption is attained.

Since the address decoder 11 is driven by the NPN transistors in the address input driver circuit 220, the buffers 201 and 211 need only drive the NPN transistors 600, 601, 602 and 603. Accordingly, the buffers 201 and 211 may be constructed by relatively small MOS FET's. When the buffers 201 and 211 are of CMOS structure, it is more effective to save the power consumption. Since the collectors of the NPN transistors 601 and 602 may be common, a space of the bipolar transistor circuits can be reduced. The same is true for bipolar transistor circuits of the other buffers.

Address Decoder 11

FIG. 7 shows a detail of the address decoder 11 shown in FIG. 4. The address decoder 11 is arranged in an array and it is preferably constructed by MOS FET's to reduce a space. In the present embodiment, an OR array is used. For example, when the 9-bit address signal $\bar{c}$ is all "0", a signal $d_{1-9}$ is LOW and a signal $\bar{d}_{1-9}$ is HIGH. As a result, only a word signal $e_0$ is HIGH so that a word 0 is selected.

A multi-emitter NPN transistor or a combination of bipolar transistors and MOS FET's may be used in the address decoder 11.

Word Drivers 12

FIG. 8 shows a detail of the word drivers 12 shown in FIG. 4. Since the word drivers have large loads as the address input buffers do, NPN transistors are used to enhance current drive capabilities. The NPN transistors 50000–50511 serve to charge corresponding word drive signal lines $f_0$–$f_{511}$ to high level, and MOS FET's 51000–51511 serve to discharge the word drive line $f_i$ charged in the previous cycle. The word drive line $f_i$ is forcedly discharged in the pre-charge period (period E) for the bit lines. A power line $\bar{a}$ to the NPN transistors 50000–50511 is synchronized with the period $\bar{E}$ and the word drive line $f_i$ is not charged in the period E.

The above operation is carried out in the period E as shown in FIG. 5.

The word drive lines $f_0$–$f_{511}$ are discharged by the MOS FET's 51000–51511 so that they are discharged during the operation period of the address decoder 11 in the period E (a period from the settlement of the signal d to the settlement of the word signals $e_0$–$e_{511}$). Thus, the NPN transistors may be of small size. This circuit portion does not affect to the critical path. When the above operation time is very short, the bipolar transistor configuration is effective. On the other hand, the word drive lines $f_0$–$f_{511}$ are charged by the NPN transistors 50000–50511. Thus, the operation times of the word drive, the discharge of the bit lines by the memory cells and the operation of the sense circuit, which occur in the period $\bar{E}$ are shortened, and hence the period $\bar{E}$ is shortened so that a fast access is attained. By utilizing the NPN transistors in the paths which are critical to the fast access and utilizing the MOS FET's in the non-critical paths, a high speed operation is attained with small circuits.

Since the MOS FET's of the address decoder 11 need only drive one of the NPN transistors 50000–50511, they may be of small size.

Since the word signals $e_0$–$e_{511}$ which are the outputs of the OR-array address decoder 11 are high when they are active, the word driver of the present invention does not need polarity inversion and hence it may be constructed by one NPN transistor and one MOS FET as opposed to the prior art MOS FET word driver which needs two inverter stages (four MOS FET's). As a result, a high speed driver is attained with a smaller area. The number of bipolar transistors used can be reduced to a minimum and the heat generation by the bipolar transistors can be suppressed.

Memory Cells 13 and Pre-charging Circuit 14

FIG. 9 shows a detail of the memory cells 13 and the pre-charging circuit 14. Like the address decoder 11, the memory cells 13 is arranged in an array and constructed by MOS FET's. As shown in FIG. 9, it is an OR array which is combined with the pre-charging circuit 14 to form a dynamic array by which the discharge of bit lines $b_0$–$b_{127}$ by the memory cells are inhibited during the pre-charging period (period E). The capacitive loads of the bit lines $b_0$–$b_{127}$ are large because up to 512 MOS FET's are added thereto. Thus, the pre-charging circuit 14 uses NPN transistors 6000–6127 to increase charging speeds to the bit lines $b_0$–$b_{127}$.

The memory cells 13 may be constructed by combinations of bipolar transistors and MOS FET's and the NPN transistors used in the pre-charging circuit 14 may be a multi-emitter transistor.

Multiplexer and sense circuit 15

FIG. 10 shows a detail of the multiplexer and sense circuits 15. As described above, each word selected by the address decoder 11 consists of 128 bits. If one memory word consists of 32 bits, four memory words are contained in a word selected by the address decoder 11. Multiplexers 700–731 shown in FIG. 10 each selects one bit from each of the bit line sets $b_0$–$b_3$, $b_4$–$b_7$, . . . , $b_{124}$–$b_{127}$ to read the required word.

Each of sense circuits 732–763 corresponds to one of the multiplexers 700–731. NPN transistors 7000–7031 serve to pre-charge the outputs of the multiplexers 700–731 and NPN transistors 7100–7131 serve to discharge the outputs. The NPN transistors 7000–7031 are active during the period E and the NPN transistors 7100–7131 are active during the period $\bar{E}$. They serve to accelerate the discharge by the memory cells of the bit lines electrically connected through the multiplexers 700–731. More specifically, in the sense circuit 732, a signal line $g_0$ is pre-charged in the period E by the NPN transistor 7000. During the period $\bar{E}$, one of the bit lines $b_0$–$b_3$ is connected to the signal line $g_0$ by the MOS FET. Assuming that the bit line $b_0$ is connected, one of the memory cells connected to the bit line $b_0$ starts to discharge the bit line $b_0$ and the signal line $g_0$ also starts to discharge. In the period $\bar{E}$, the signal line (clock) a is "0", and a NOR gate 7200 constructed by MOS FET's, which receives the clock a and the signal line $g_0$ by the memory cell to raise an output signal s to "1". The signal line s is connected to a base of an NPN transistor 7100, which flows a base current in response to a small voltage rise to turn it on. As a result, the signal line $g_0$ is discharged to "0" at a high speed.

The above operation is applicable to other sense circuits 733–763. By constructing the pre-charging NPN transistors 7000–7031 by a multi-emitter transistor, the space of the circuits can be reduced.

Referring to the FIGS. 11a and 11b, a detail of the voltage drop detection of the signal line $g_0$ by the NOR gate 7200 is explained. FIG. 11a shows a detail of the sense circuit 732 and FIG. 11b shows waveforms thereof.

(1) Period E

During the period E, the clock a is "1". Thus, the signal line $g_0$ is charged by the NPN transistor 7000. On the other hand, the base input signal s to the NPN transistor 7100 is "0" by the NMOS transistor 802 of the NOR gate 7200. Accordingly, the signal line $g_0$ is not discharged by the NPN transistor 7100.

(2) Period $\bar{E}$

During the period $\bar{E}$, the clock a is "0" and the signal line $g_0$ is initially "1". The PMOS transistor 800 and the NMOS transistor 803 of the NOR gate 7200 are ON, and the PMOS transistor 801 and the NMOS transistor 802 are OFF. Under this condition, the NOR gate 7200 functions as an inverter by the PMOS transistor 801 and the NMOS transistor 803. When the signal line $g_0$ starts to discharge by the memory cell, a resulting voltage drop in the signal line $g_0$ is amplified by a gain of the inverter to produce the output signal s. Accordingly, the NPN transistor 7100 can be turned on by a small voltage drop in the signal line $g_0$. FIG. 11b shows waveforms of the above operation. When the signal line $g_0$ reaches a certain voltage level (sense level) during the discharge by the memory cell (MOS), it is thereafter discharged at a high speed by the NPN transistor 7100.

Output Buffers 16

FIG. 12 shows a detail of the output buffers 16 with latches. Latches 8000–8031 are master/slave dynamic MOS latches which store data in the periods $\bar{E}$ and E. When loads are small, inverters 8100–8131 at a final stage connected to the internal bus (117 in FIG. 1) may be MOS inverters. When the capacitive loads of the logic blocks including the internal bus are large, it is effective to construct the inverters by bipolar transistors.

In accordance with the present embodiment, the advantages of the compactness and the low power consumption of the MOS FET's and the high current drive capability of the bipolar transistors are effectively utilized. Accordingly, a high speed and high integration ROM can be attained in a microcomputer LSI.

In the above embodiment, each of the logic units of the ROM 112 is constructed by a matrix of a number of units each consisting of one MOS FET. On the other hand, as shown in FIG. 13, the memory cells of the RAM 113 which is one of the logic blocks of the microcomputer is constructed by a matrix of a plurality of units each consisting of a plurality of MOS FET's. In such a memory, the capacitive load also increases by the high integration. Accordingly, the increase of the signal transmission delay can be prevented by driving the load by bipolar buffers construted by bipolar transistors.

FIG. 14 shows a configuration of a processing circuit of the processor 114 in one embodiment of the present invention. It is constructed in a different manner from the ROM 112 descrived above. The processing circuit 90 is constructed by a matrix of different logic units such as ALU 91, shifter 92, operation registers 93, input register 94 and output register 95, which are connected to buses 96a and 96b. The output register 95 is connected to the internal bus (117 in FIG. 1) of the microcomputer by a bipolar buffer 97 to enhance the drive capability to the internal bus as is done in the output buffers 16 of the ROM 112.

In the processing circuit 90, an output of a microprogram memory 99 of the same construction as the ROM 112, in the processor of the microprogram-controlled microcomputer is decoded by a microinstruction decoder 98, and the output thereof is amplified by a bipolar buffer 1000. The microinstruction from the microprogram memory 99 is decoded by the microinstruction decoder 98 to control the processing circuit 90. While not shown, the microinstruction decoder 98 comprises a random arrangement and/or at least one PLA (Programmable logic array) of logic units. The outputs of the randomly arranged logic units are also amplified by the bipolar buffer 1000 so that the heavy load processing circuit 90 is controlled at a high speed.

FIG. 15 shows a detail of a portion of FIG. 14 and FIG. 16 shows waveforms thereof. The microinstruction read from the microprogram memory 99 is decoded by the microinstruction decoder 98 into signals to control the processing circuit 90. As an example, a register-to-register operation is explained below.

(1) Readout of Register

The microinstruction selects registers which are to be sent out the data to buses $rb_0$ and $rb_1$, by the decoders (e.g. 152 and 153) constructed by MOS FET's. Assuming that the two registers shown are selected from the registers 93, the outputs 14h and 14j of the decoders 152 and 153 assume "1", respectively, and the signal lines 14c and 14e are driven at a high speed by the NPN transistors 148 and 150 in the period E (clock a is "1"). The data read MOS gates 137 and 141 of the respective registers are driven by the signal lines 14c and 14e and the data of the respective registers are sent out to the buses $rb_0$ and $rb_1$, respectively. Since the readout of the register to the bus is required at the beginning of one micro-operation, a highest speed is required. The MOS FET's 149 and 151 are used to keep the signal lines 14c and 14e to "0" during the period $\bar{E}$ (clock $\bar{a}$ is "1") to inhibit the readout of the registers. The drivers for reading the registers can be implemented by the same circuit as the word drivers shown in FIG. 8.

By pre-charging the buses $rb_0$ and $rb_1$ in the period $\bar{E}$ and adding the sense circuits 732 shown in FIGS. 10, 11a and 11b to discharge the buses, the speed of the readout of the registers can be increased.

(2) Latching of Data on Buses

The data sent out to the buses $rb_0$ and $rb_1$ are latched during the period E by the MOS FET's 130 and 131 arranged at the input of the ALU 91.

(3) Arithmetic Operation

The latched data $d_0$ and $d_1$ are processed by the processing circuit 132 of the ALU 91 under the control of the signal 14a derived by driving the MOS inverters 143–145 by the operation code signal 14f. The result is sent out to the bus Wb by the driver constructed by the NPN transistor 133 and the MOS FET 134. This driver maintains the bus Wb at "0" during the period E, and if the result r is "0", it keeps the bus Wb unchanged during the period $\bar{E}$, and if the result r is "1", it charges the bus Wb to "1" by the NPN transistor 133.

(4) Writing to Registers

The data on the bus Wb is written into one of the registers 93 which has "0" output at the corresponding write decoder. For example, if the outputs 14g and 14i of the decoders 154 and 155 are "0" the write pulses synchronized with the clock a are produced on the signal lines 14b and 14d by the MOS gates 146 and 147 in the period $\bar{E}$, and the data on the bus Wb is written into the register through the MOS gates 138 and 142.

In the one micro-operation described above, the register readout to be executed first is the worst critical path. Thus, the readout signals 14c and 14e must be driven at a high speed by the NPN transistors 148 and 150. The bipolar driver 1000 is thus characterized by the use of the NPN transistors in the critical path area.

FIG. 16 shows waveforms of the signals described above.

Bipolar transistors may be arranged at the outputs of the ALU 91, shifter 92, operation registers 93, input register 94 and output register 95 of the processing circuit 90 to enhance the drive capability of the outputs depending on a degree of integration of the driven units so that the increase of the signal transmission delay can be prevented.

In accordance with the present embodiment, the bipolar buffer constructed by the bipolar transistors is inserted between the high integration logic blocks such as processor and ROM in the microcomputer or between high integration logic units of the logic block such as the MOS address decoder of the ROM and the MOS memory to current-amplify the output of the preceding stage so that the logic unit or the logic block in the succeeding stage is positively driven. As a result, even if the capacitive load increases by the high integration of the MOS FET's, the signal transmission delay between the logic units or the logic blocks is prevented and the high integration of the semiconductor circuit is attained while maintaining the high speed. The bipolar buffer can be formed on a silicon chip of several millimeters square together with the logic units or the logic blocks. Since the bipolar transistors are distibutedly arranged, local heat generation by the bipolar transistors is prevented.

When the function of the processor is complex, a number of MOS FET's must be integrated to form the processor on a silicon chip. In such a high integration processor, the decrease of the signal transmission speed due to the increase of the capacitive load is again a problem.

FIG. 17 shows a configuration of a high integration processor in another embodiment of the present invention. As seen from FIG. 17, the processor has almost the same configuration as that of the processor which is one of the logic blocks shown in FIG. 14 but the processor is constructed by an LSI to attain high integration.

In FIG. 17, the primed numerals denote the elements of the corresponding numerals shown in FIG. 14 except for an internal bus 117' and a microinstruction control block 900'. Only the scale of integration differs. A processing circuit 90' and the microinstruction control block 900' in FIG. 17 may correspond to the logic blocks, and an ALU 91', a shifter 92', operation registers 93', an input register 94', an output register 95', a microinstruction decoder 98' and a microprogram memory 99' may correspond to the logic units, and buses 96'a, 96'b and the internal bus 117', and a buffer 1000' including bipolar transistors correspond to the coupling circuits. The operation is similar to that of FIG. 14 and a detailed explanation thereof is omitted here.

As described herein above, according to the semiconductor integrated circuit device of the present invention, the coupling circuit having at least a portion thereof constructed by the bipolar transistors is inserted between the logic blocks of the integrated circuit device or between the logic units of the logic block. Accordingly, the high integration of the semiconductor integrated circuit device is attained while maintaining the high speed.

We claim:

1. A memory circuit formed on a semiconductor substrate comprising:

a plurality of memory cells, each including at least one metal oxide semiconductor field effect transistor (MOSFET), which are located at corresponding interconnections between a plurality of word lines and a plurality of bit lines;

an address input buffer circuit to which address signals are inputted;

an address decoder circuit to which output signals of said address input buffer circuit are inputted;

a word driver circuit responsive to outputs of said address decoder circuit, wherein said word driver comprises at least one bipolar transistor having a base coupled to a source-drain current path of at least one metal oxide semiconductor field effect transistor (MOSFET) of the address decoder and an emitter-collector current path connected to a gate of at least one MOSFET of at least one of the memory cells; and a sense circuit coupled to said bit lines, for detecting at least one datum in said plurality of memory cells, wherein said sense circuit includes a first bipolar transistor having a base coupled to a control signal line and an emitter-collector current path coupled between one of said bit lines and a first voltage source to charge said one of said bit lines at a high speed, a logic circuit comprised of MOSFETs and having inputs coupled to said control signal line and said one of said bit lines to produce a logical output, and a second bipolar transistor having a base coupled to the logical output of said logic circuit and an emitter-collector current path coupled between said one of said bit lines and a second voltage source to discharge said one of said bit lines at a high speed in response to the logical output.

2. A memory device formed on a semiconductor substrate comprising:

a plurality of memory cells, each including at least one MOSFET, which are located at corresponding interconnections between a plurality of word lines and a plurality of bit lines;

an address input buffer circuit to which address signals are inputted;

an address decoder circuit to which output signals of said address input buffer circuit are inputted, wherein said address decoder circuit comprises a plurality of MOSFETs;

a word driver circuit responsive to outputs of said address decoder circuit, wherein said word driver circuit comprises at least one bipolar transistor having an emitter directly connected to one of the MOSFETs in the plurality of memory cells via one of said word lines and having a base directly connected to one of said MOSFETs of said address decoder circuit to thereby provide a MOSFET-bipolar transistor-MOSFET path to reduce signal transmission delay in a signal passing from the address decoder circuit to said memory cells;

a sense circuit coupled to said bit lines, for detecting at least one datum in said plurality of memory cells, wherein said sense circuit comprises a plurality of MOSFETs and further includes an output driver circuit connected to said plurality of MOSFETs of said sense circuit, wherein said output driver circuit comprises at least one bipolar transistor having a base directly connected to at least one of said MOSFETs of said sense circuit, and having a collector-emitter current path coupled to one of said bit lines to provide a high speed discharge of said one of said bit lines; and an output buffer circuit connected to said sense circuit, wherein said output buffer circuit comprises at least one bipolar transistor which is coupled to at least one of said MOSFETs of said sense circuit, wherein the at least one bipolar transistor of said output buffer circuit is coupled to provide output signals to a bus to reduce signal transmission delays in driving said bus.

3. A memory device according to claim 2, wherein an emitter of said at least one bipolar transistor of said output driver circuit is directly connected to the output buffer circuit.

* * * * *